United States Patent
Jang et al.

(10) Patent No.: US 9,334,560 B2
(45) Date of Patent: May 10, 2016

(54) APPLICATION OF METALLIC GLASS AND METALLIC GLASS THIN FILM COATING ON THE SHARPNESS ENHANCEMENT OF CUTTING TOOLS

(75) Inventors: Jason Shiang Ching Jang, Jhongli (TW); Pei Hua Tsai, Tainan (TW); Jia Bin Li, Jhongli (TW); Yu Ze Lin, Kaohsiung (TW); Chih Chiang Fu, Kaohsiung (TW); Jinn P. Chu, Taipei (TW)

(73) Assignee: National Central University, Jhongli, Taoyuan County (TW)

( * ) Notice: Subject to any disclaimer, the term of this patent is extended or adjusted under 35 U.S.C. 154(b) by 479 days.

(21) Appl. No.: 13/605,688

(22) Filed: Sep. 6, 2012

(65) Prior Publication Data

US 2013/0108888 A1 May 2, 2013

(30) Foreign Application Priority Data

Nov. 2, 2011 (TW) .............................. 100139977 A

(51) Int. Cl.
| | |
|---|---|
| *C22C 45/10* | (2006.01) |
| *C23C 14/16* | (2006.01) |
| *C23C 14/34* | (2006.01) |
| *C23C 30/00* | (2006.01) |
| *B32B 15/01* | (2006.01) |
| *C22C 1/00* | (2006.01) |
| *B22D 7/00* | (2006.01) |
| *B22D 18/06* | (2006.01) |

(52) U.S. Cl.
CPC .............. *C23C 14/165* (2013.01); *B22D 7/005* (2013.01); *B32B 15/01* (2013.01); *C22C 1/002* (2013.01); *C22C 45/10* (2013.01); *C23C 14/3414* (2013.01); *C23C 30/00* (2013.01); *B22D 18/06* (2013.01); *Y10T 83/929* (2015.04); *Y10T 83/9403* (2015.04); *Y10T 428/12778* (2015.01); *Y10T 428/12806* (2015.01)

(58) Field of Classification Search
None
See application file for complete search history.

(56) References Cited

U.S. PATENT DOCUMENTS 8,163,109 B1 * 4/2012 Kecskes et al. ............... 148/403

FOREIGN PATENT DOCUMENTS

| CN | 101768718 A | 7/2010 |
|---|---|---|
| KR | 929618 B1 * | 12/2009 |
| TW | 201026868 A | 7/2010 |
| TW | 201122125 A | 7/2011 |

OTHER PUBLICATIONS

English machine translation KR 929618 B1, printed Aug. 31, 2014.*
Chu et al., Thin film metallic glasses: Unique properties and potential applications, Apr. 9, 2012, Thin Solid Films, Elsevier, 520(2012) 5097-5122.*
Tsai et al., Sharpness improvmernt of surgical blade by means of ZrCuAlAgSi metallic glass and metallic glass thin film coating, Jul. 20, 2012, Intermetallics 31(2012) pp. 127-131.*
J.C. Huang, J.P. Chu, J.S.C. Jang, "Recent Progress in Metallic Glasses in Taiwan", Intemetallics, vol. 17 (2009) pp. 973-987.

* cited by examiner

*Primary Examiner* — Adam Krupicka
(74) *Attorney, Agent, or Firm* — Muncy, Geissler, Olds & Lowe, P.C.

(57) ABSTRACT

A cutting tool having a metallic glass thin film (MGTF) coated thereon, a metallic glass cutting tool, and methods of fabricating the same are disclosed. The cutting tool having metallic glass thin film coated thereon comprises: a cutting element having a sharpened portion, and the cutting element is made of metal; and a metallic glass thin film coated on the cutting element, and the metallic glass is represented by the following formula 1 or formula 2, $$(Zr_a Cu_b Ni_c Al_d)_{100-x} Si_x, \quad \text{[formula 1]}$$

wherein $45 \leq a \leq 75$, $25 \leq b \leq 35$, $5 \leq c \leq 15$, $5 \leq d \leq 15$, $0.1 \leq x \leq 10$, $$(Zr_e Cu_f Ag_g Al_h)_{100-y} Si_y, \quad \text{[formula 2]}$$

$35 \leq e \leq 55$, $35 \leq f \leq 55$, $5 \leq g \leq 15$, $5 \leq h \leq 15$, $0.1 \leq y \leq 10$.

The metallic glass cutting tool of the present invention comprises: a cutting element having a sharpened portion, and the cutting element is made of a metallic glass represented by the above formula 1 or formula 2.

21 Claims, 2 Drawing Sheets

APPLICATION OF METALLIC GLASS AND METALLIC GLASS THIN FILM COATING ON THE SHARPNESS ENHANCEMENT OF CUTTING TOOLS

CROSS REFERENCE TO RELATED APPLICATION

This application claims the benefits of the Taiwan Patent Application Serial Number 100139977, filed on Nov. 2, 2011, the subject matter of which is incorporated herein by reference.

BACKGROUND OF THE INVENTION

1. Field of the Invention

The present invention relates to a cutting tool having a metallic glass thin film (MGTF) coated thereon, a metallic glass cutting tool, and methods of fabricating the same and, more particularly, to a cutting tool having an MGTF and a metallic glass cutting tool which can be used independently as, for example, knives, saws, blades, or cutter wheels; and methods of fabricating the same.

2. Description of Related Art

Cutting tools such as knives or saws are used as equipment such as cooking knives, surgical knives, military knives, art tooling knives, industrial knives, carpentry saws, medical saws, and metal-cutting saws. Those cutting tools are usually made of stainless steel, ceramic, high-carbon steel, tungsten steel, or etc. Martensitic stainless steel is the most used material to manufacture medical knives and other equipment due to the advantages of being, for example, easy to obtain, easy to process, and low cost. For cutting tools, key requirements are to have enough hardness, sharpness, chemical-resistance, corrosion resistance, and less adhesive property. Also, for commercial purposes, it is desired to be easily produced, and have a low-manufacturing cost.

As for estimating the sharpness of a knife, a Blade Sharpness Index (BSI) can be used with tests and calculations (C. T. McCarthy, M. Hussey, M. D. Gilchrist. "On the sharpness of straight edge blades in cutting soft solids: Part I—indentation experiments", Engineering Fracture Mechanics, vol. 74, p. 2205-2224, 2007). The sharpness represents efficiency of cutting. For example, the better the sharpness (a lower Blade Sharpness Index) the more efficient the cut, which can help realize a short recovery time for patients following surgery.

Therefore, it is desirable to provide an improved material for providing cutting tools having high sharpness (low Blade Sharpness Index) with low manufacturing cost, which can be used for medical, daily life, and industrial purposes.

SUMMARY OF THE INVENTION

Hence, the present invention provides a cutting tool having a metallic glass thin film (MGTF) coated thereon, which comprises: a cutting element having a sharpened portion, and the cutting element is made of metal; and a metallic glass thin film which is coated on the cutting element, and a composition of the metallic glass thin film is represented by the following formula 1 or formula 2,

   [formula 1]

wherein $45 \leq a \leq 75$, $25 \leq b \leq 35$, $5 \leq c \leq 15$, $5 \leq d \leq 15$, $0.1 \leq x \leq 10$,

   [formula 2]

$35 \leq e \leq 55$, $35 \leq f \leq 55$, $5 \leq g \leq 15$, $5 \leq h \leq 15$, $0.1 \leq y \leq 10$.

In the present invention, the composition of the metallic glass thin film according to the formula 1 is a composition of a zirconium-based metallic glass; and the composition of the metallic glass thin film according to the formula 2 is a composition of a zirconium-copper-based metallic glass.

"A metallic glass" means that the metal atoms in the amorphous metal have no long-term continuous regular arrangement, but only short term-regular arrangement. In other words, the atomic arrangement in metallic glass is very different from that in metal with long-term continuous regular arrangement. Metallic glass has advantages such as high thermo-stability, high tensile strength, high elasticity, high impact toughness, excellent anti-corrosion ability, and excellent magnetic properties (e.g. Fe, Co-based alloy). For example, a tensile strength and a Vickers hardness of a zirconium-based metallic glass are 1600 to 1800 MPa and 500 to 650 respectively, while the density thereof is only 5.9 to 6.7 kg/l. Metallic glass thin film can be used to increase the anti-corrosion ability for medical tools. Corrosion is usually starting from defects such as grain boundaries, because chemical activity in grain boundaries is stronger. However, metallic glass has no grain boundaries or dislocation, and therefore has better anti-corrosion ability.

When a surgical knife is coated with metallic glass thin film, the surface roughness can be decreased so the friction force can be reduced and thus is favorable for the recovery of surgery patients (e.g. following microsurgical repair of a nerve). Through experiments, it is proved that the cutting tool having a metallic glass thin film coated thereon of the present invention has a higher sharpness (lower Blade Sharpness Index of about 30%) than commercially available surgical knives, and therefore the cutting tool of the present invention is an improved medical cutting tool.

According to the present invention, a cutting element is coated with a metallic glass thin film and therefore the sharpness of the cutting element can be improved. The technique of the present invention can be applied to a wide variety of cutting tools. For example, when a surgical knife is coated with a metallic glass thin film of the present invention, surface roughness is decreased so the friction force during the surgical operation can be reduced, which is favorable for shortening the recovery time for the patient after the surgery. Also, it is proved that the metallic glass thin film of the present invention has an excellent adhesive force so the metallic glass thin film is not easily peeled, which means the metallic glass thin film of the present invention can have a long lifespan. Furthermore, by experiment, it is proved that the metallic glass thin film of the present invention can improve the hardness of a cutting tool.

According to the present invention, a cutting tool having an MGTF coated thereon can increase the sharpness about 30% more than that of a commercial surgical knife, e.g. a BSI of the cutting tool of the present invention is about 0.2 to 0.28.

According to the present invention, the cutting tool having an MGTF coated thereon, when the composition of the metallic glass thin film is represented by the formula 1 (i.e. zirconium-based metallic glass thin film), the blade sharpness index of the cutting tool is preferably 0.23 to 0.28 (e.g. 0.25).

According to the present invention, the cutting tool having an MGTF coated thereon, when the composition of the metallic glass thin film is represented by the formula 2 (i.e. zirconium-copper-based metallic glass thin film), the blade sharpness index of the cutting tool is preferably 0.2 to 0.25 (e.g. 0.23).

According to the present invention, the cutting tool having an MGTF coated thereon, the thickness of the metallic glass thin film is preferably 100 nm to 500 nm (e.g. 200 nm).

Preferably, the cutting tool having an MGTF coated thereon of the present invention further comprises a buffering layer locating between the cutting element and the metallic glass thin film. The buffering layer can be used to increase the adhesive force between the metallic glass thin film and the cutting element.

According to the present invention, the cutting tool having an MGTF coated thereon, the thickness of the buffering layer is preferably 10 nm to 100 nm, e.g. 50 nm.

According to the present invention, the cutting tool having an MGTF coated thereon, the buffering layer is preferably made of titanium.

According to the present invention, the cutting tool having an MGTF coated thereon, the cutting tool can preferably be a surgical knife, bone saw, or other applied equipment. Cutting tools of the present invention may also be applied to daily life-use cutting tools or military tools, such as cooking knives, surgical knives, military knives, art tooling knives, industrial knives, carpentry saws, medical saws, or metal-cutting saws.

According to the present invention, the cutting tool having an MGTF coated thereon, the hardness of the cutting tool is preferably 700 Hv to 800 Hv; more preferably 700 Hv to 750 Hv, e.g. 725 Hv or 740 Hv.

According to the present invention, the cutting tool having an MGTF coated thereon, the [formula 1] is preferably $(Zr_{53}Cu_{30}Ni_9Al_8)_{99.5}Si_{0.5}$; and the [formula 2] is preferably $(Zr_{42}Cu_{42}Al_8Ag_8)_{99.5}Si_{0.5}$.

The present invention further provides a method of forming a metallic glass thin film (MGTF) on a cutting element, which comprises steps: (A) providing a metallic glass target, and a composition of the metallic glass target is represented by a following formula 1 or formula 2; and (B) sputtering to form the metallic glass thin film on a surface of the cutting element by using the metallic glass target as a cathode;

$(Zr_aCu_bNi_cAl_d)_{100-x}Si_x$, [formula 1]

wherein $45=<a=<75, 25=<b=<35, 5=<c=<15, 5=<d=<15, 0.1=<x=<10$,

$(Zr_eCu_fAg_gAl_h)_{100-y}Si_y$, [formula 2]

$35=<e=<55, 35=<f=<55, 5=<g=<15, 5=<h=<15, 0.1=<y=<10$.

In the present invention, the composition of the metallic glass thin film according to the formula 1 is a composition of a zirconium-based metallic glass; and the composition of the metallic glass thin film according to the formula 2 is a composition of a zirconium-copper-based metallic glass.

According to the method of the present invention for forming an MGTF on a cutting element, a metallic glass thin film can be formed on a cutting element to improve the sharpness (i.e. decrease the blade sharpness index) of the cutting element. The method of the present invention for forming an MGTF on a cutting element can be applied to a wide variety of cutting tools. For example, when a surgical knife is coated with a metallic glass thin film according to the present invention, surface roughness is decreased so the friction force during the surgical operation can be reduced and thus is favorable for shortening the recovery time for the patient. Also, it is proved that the metallic glass thin film of the present invention has excellent adhesive force so the metallic glass thin film is not easily peeled, which means the metallic glass thin film of the present invention can have a long lifespan. Furthermore, by experiment, it is proved that the metallic glass thin film of the present invention can improve the hardness of a cutting tool.

According to the method of the present invention for forming an MGTF on a cutting element, the metallic glass target can preferably be provided by the following steps: (A1) melting (such as arc melting) and mixing raw materials in a composition according to the formula 1 or the formula 2 and forming an ingot from the mixture; (A2) vacuum suction casting the ingot and cooling (such as water cooling) to form a sheet; and (A3) reprocessing the sheet to form the metallic glass target.

According to the method of the present invention for forming an MGTF on a cutting element, the cooling in the step (A2) is preferably rapid cooling.

According to the method of the present invention for forming an MGTF on a cutting element, the method is preferably used to improve (i.e. decrease) the blade sharpness index (BSI) of the cutting element.

According to the method of the present invention for forming an MGTF on a cutting element, in the step (B), the thickness of the metallic glass thin film is preferably 100 nm to 500 nm, e.g. 200 nm.

Before the step (B), the method of the present invention for forming an MGTF on a cutting element may further comprise a step (B0): forming a buffering layer on surface of the cutting element, in which the buffering layer can be made of titanium, and the thickness of the buffering layer can be 10 nm to 100 nm, e.g. 50 nm.

According to the method of the present invention for forming an MGTF on a cutting element, before the step (B), the cutting element can be pre-treated at the surface. For example, the surface of the cutting element can be grinding polished, electro-polished, or other treatments as known to the art.

According to the method of the present invention for forming an MGTF on a cutting element, in the step (B), the sputtering may be preferably performed with a gas pressure of $1\times10^{-4}$ Pa to $1\times10^{-2}$ Pa.

According to the method of the present invention for forming an MGTF on a cutting element, in the step (B), the sputtering may be preferably performed in an inert gas (such as He, Ne, Ar) or nitrogen gas atmosphere.

According to the method of the present invention for forming an MGTF on a cutting element, the [formula 1] is preferably $(Zr_{53}Cu_{30}Ni_9Al_8)_{99.5}Si_{0.5}$; and the [formula 2] is preferably $(Zr_{42}Cu_{42}Al_8Ag_8)_{99.5}Si_{0.5}$.

The present invention also provides for a metallic glass cutting tool, which comprises: a cutting element having a sharpened portion, the cutting element is made of a metallic glass, and a composition of the metallic glass is represented by a following formula 1 or formula 2;

$(Zr_aCu_bNi_cAl_d)_{100-x}Si_x$, [formula 1]

wherein $45=<a=<75, 25=<b=<35, 5=<c=<15, 5=<d=<15, 0.1=<x=<10$,

$(Zr_eCu_fAg_gAl_h)_{100-y}Si_y$, [formula 2]

$35=<e=<55, 35=<f=<55, 5=<g=<15, 5=<h=<15, 0.1=<y=<10$.

In the present invention, the composition of the metallic glass according to the formula 1 is a composition of a zirconium-based metallic glass; and the composition of the metallic glass according to the formula 2 is a composition of a zirconium-copper-based metallic glass.

According to the present invention, the metallic glass-cutting tool whole cutting element is made from a metallic glass (either a zirconium-based metallic glass or a zirconium-copper-based metallic glass), and a sharp cutting edge is obtained after polishing (without any coated film). In detail, even though the metallic glass-cutting tool of the present invention is not coated with a metallic glass thin film, an excellent sharpness (low blade sharpness index) is realized. The metallic glass-cutting tool of the present invention can be applied to a wide variety of cutting tools. For example, when a surgical knife is made of metallic glass according to the present invention, surface roughness is decreased so the friction force during the surgical operation can be reduced and thus is favorable for shortening the recovery time for the patient. The metallic glass-cutting tool of the present invention may also be applied to daily life-use cutting tools or military tools, such as cooking knives, surgical knives, military knives, art tooling knives, industrial knives, carpentry saws, medical saws, and metal-cutting saws, with high cutting efficiency.

"A metallic glass" means that the metal atoms in the amorphous metal have no long-term continuous regular arrangement, but only short term-regular arrangement. In other words, the atomic arrangement in metallic glass is very different from that in metal with long-term continuous regular arrangement. Metallic glass has advantages such as high thermo-stability, high tensile strength, high elasticity, high impact toughness, excellent anti-corrosion ability, and excellent magnetic properties (e.g. Fe, Co-based alloy). For example, the tensile strength and Vickers hardness of zirconium-based metallic glass are 1600 to 1800 MPa and 500 to 650 respectively, while the density thereof is only 5.9 to 6.7 kg/l. Metallic glass thin film can be used to increase the ability of anti-corrosion for medical tools. Corrosion is usually growing starting from defects such as grain boundaries, because chemical activity in grain boundaries is stronger. However, metallic glass has no grain boundaries or dislocation, and therefore has better anti-corrosion ability According to the present invention, the metallic glass cutting tool, the hardness of the cutting element is preferably 500 Hv to 600 Hv, e.g. 550 Hv or 570 Hv.

According to the present invention, the metallic glass cutting tool, a blade sharpness index (BSI) of the cutting tool is preferably 0.25 to 0.30.

According to the present invention, the metallic glass cutting tool, when the composition of the metallic glass is represented by the formula 1, the blade sharpness index of the cutting tool is 0.25 to 0.30, e.g. 0.26.

According to the present invention, the metallic glass cutting tool, when the composition of the metallic glass is represented by the formula 2, the blade sharpness index of the cutting tool is 0.25 to 0.30, e.g. 0.25.

According to the present invention, the metallic glass cutting tool, the cutting tool may preferably be a knife, a saw, a blade, or a cutter wheel.

According to the present invention, the metallic glass cutting tool, the [formula 1] is preferably $(Zr_{53}Cu_{30}Ni_9Al_8)_{99.5}Si_{0.5}$; and the [formula 2] is preferably $(Zr_{42}Cu_{42}Al_8Ag_8)_{99.5}Si_{0.5}$.

The present invention further provide a method of providing a metallic glass cutting tool, which comprises: (A) melting (such as arc melting) and mixing raw materials in a composition according to the formula 1 or the formula 2 and forming an ingot from the mixture; (B) vacuum suction casting the ingot and rapid cooling (such as water cooling) to form a metallic glass sheet; and (C) reprocessing the metallic glass sheet to provide a cutting element having a sharpened portion, $(Zr_aCu_bNi_cAl_d)_{100-x}Si_x$, [formula 1]

wherein $45 \leq a \leq 75$, $25 \leq b \leq 35$, $5 \leq c \leq 15$, $5 \leq d \leq 15$, $0.1 \leq x \leq 10$, $(Zr_eCu_fAg_gAl_h)_{100-y}Si_y$, [formula 2]

$35 \leq e \leq 55$, $35 \leq f \leq 55$, $5 \leq g \leq 15$, $5 \leq h \leq 15$, $0.1 \leq y \leq 10$.

Herein, the composition of the metallic glass according to the formula 1 is a composition of a zirconium-based metallic glass; and the composition of the metallic glass according to the formula 2 is a composition of a zirconium-copper-based metallic glass.

According to the present invention, the provided metallic glass cutting tool, the whole cutting element is made from a metallic glass (either a zirconium-based metallic glass or a zirconium-copper-based metallic glass) sheet, and a sharp cutting edge is obtained after polishing (without any coated film). In detail, even though the metallic glass-cutting tool made by the present invention is not coated with a metallic glass thin film, an excellent sharpness (low blade sharpness index) is realized. The metallic glass-cutting tool made by the present invention can be applied to a wide variety of cutting tools. For example, when a surgical knife is made of a metallic glass according to the present invention, surface roughness is decreased so the friction force during the surgical operation can be reduced and thus is favorable for shortening the recovery time for the patient According to the present invention, the method of providing a metallic glass cutting tool in the step (C), the metallic glass sheet may be reprocessed preferably by cutting to provide the cutting element.

According to the present invention for providing a metallic glass cutting tool, the [formula 1] is preferably $(Zr_{53}Cu_{30}Ni_9Al_8)_{99.5}Si_{0.5}$; and the [formula 2] is preferably $(Zr_{42}Cu_{42}Al_8Ag_8)_{99.5}Si_{0.5}$.

According to the present invention for providing a metallic glass cutting tool, in the step (B), the rapid cooling is preferably performed by water-cooling (e.g. cooling in a water-cooled copper mold).

Other objects, advantages, and novel features of the invention will become more apparent from the following detailed description when taken in conjunction with the accompanying drawings.

DETAILED DESCRIPTION OF THE PREFERRED EMBODIMENT

Figure 1:
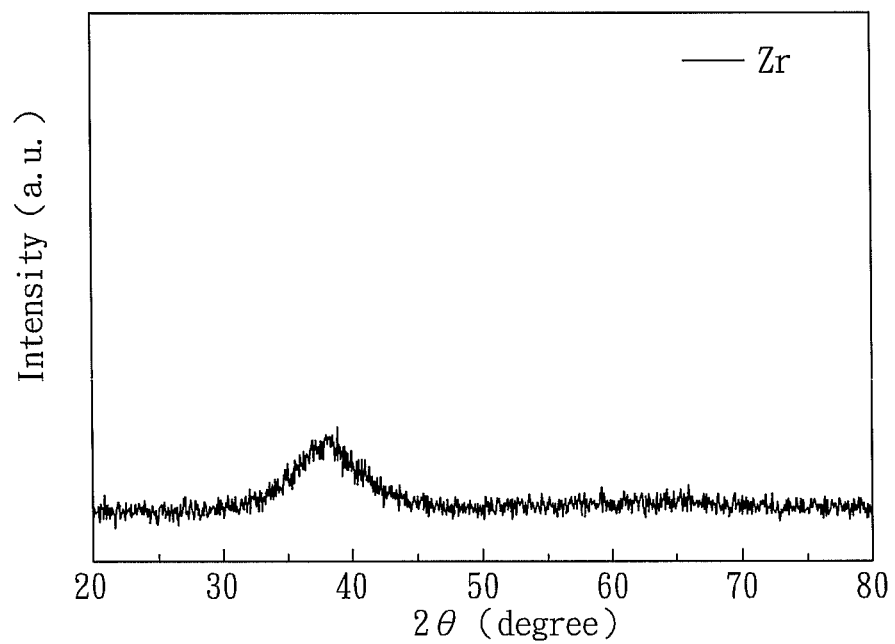
FIG. 1 is an X-ray diffraction analysis result of the metallic glass cutting tool in example 3 of the present invention.
Figure 2:
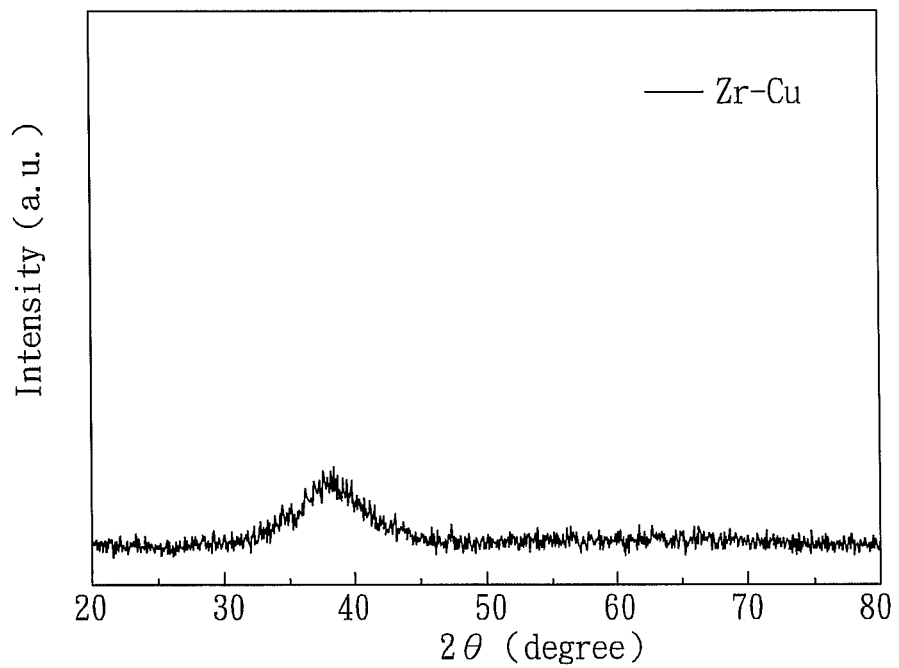
FIG. 2 is an X-ray diffraction analysis result of the metallic glass cutting tool in example 4 of the present invention.

Hereinafter, the present invention will be described in further detail with reference to examples and comparative examples. It is to be understood, however, that these examples are illustrative only and the scope of the present invention is not limited thereto. Those skilled in the art will appreciate that various modifications, additions and substitutions are possible, without departing from the scope and spirit of the invention as disclosed in the accompanying claims.

EXAMPLE 1

Forming of Cutting Tool Having a Zirconium-Based Metallic Glass (($Zr_{53}Cu_{30}Ni_9Al_8)_{99.5}Si_{0.5}$) Coated Thereon 1. Preparation of Target
Raw materials are prepared in a composition of $Zr_{53}Cu_{30}Ni_9Al_8)_{99.5}Si_{0.5}$ and are stirred to give a mixture.

The mixture is then arc-casted (using Lincoln electric INVERTEC V450-PRO) to provide an ingot in a circular shape.

The surface of the ingot is cleaned by, for example, removing the oxide layer on the surface of the ingot using a shot-blasting machine followed by placing the ingot in a beaker filled with alchohol and ultrasonic-cleaning of the surface of the ingot. After that, the cleaned ingot is placed in a vacuum suction casting furnace to be vacuum-cast under an argon-atmosphere with controlled temperature (by a constant temperature control system), and followed by rapid-cooling to obtain a metallic glass alloy plate. The alloy plate is cut by a wire-cut EDM to provide several blocks of targets (i.e. the metallic glass target of the present example) about 2 inches in diameter.

2. Sputtering to Form Zirconium-Based Metallic Glass Thin Film

A commercial surgical knife is plated with a buffering layer having a thickness of 50 nm, in which the main composition of the buffering layer is titanium.

Then, the metallic glass target is served as a cathode and the plated surgical knife for sputtering is served as an anode, and a DC Magnetron Sputter machine is used to form the metallic glass thin film of the present example. The chamber of the sputtering machine is vacuumed to $1 \times 10^{-4}$ Pa to $1 \times 10^{-2}$ Pa, argon gas is directed into the chamber and a DC high voltage is used during the sputtering process so as to form a zirconium-based metallic glass thin film (in a composition of $(Zr_{53}Cu_{30}Ni_9Al_8)_{99.5}Si_{0.5}$) having a thickness of 200 nm on the buffering layer. Therefore, a cutting tool having a metallic glass thin film (MGTF) coated thereon of the present example is obtained.

EXAMPLE 2

Formation of Cutting Tool Having a Zirconium-Copper-Based Metallic Glass $((Zr_{42}Cu_{42}Al_8Ag_8)_{99.5}Si_{0.5})$ Thin Film Coated Thereon Except that the composition of the raw materials is changed into $((Zr_{42}Cu_{42}Al_8Ag_8)_{99.5}Si_{0.5})$, other conditions and materials used in the present example are the same as those shown in the example 1, so as to form the zirconium-copper-based metallic glass target of the present example.

The zirconium-copper-based metallic glass target is then used to form/sputter a zirconium-copper-based metallic glass thin film on a commercial surgical knife. Therefore, a cutting tool having a zirconium-copper-based metallic glass $((Zr_{42}Cu_{42}Al_8Ag_8)_{99.5}Si_{0.5})$ thin film coated thereon of the present example is thus obtained.

EXAMPLE 3

Formation of Zirconium-Based Metallic Glass $((Zr_{53}Cu_{30}Ni_9Al_8)_{99.5}Si_{0.5})$ Cutting Tool Raw materials are prepared in a composition of $Zr_{53}Cu_{30}Ni_9Al_8)_{99.5}Si_{0.5}$ and are stirred to give a mixture. The mixture is then arc-casted (using Lincoln electric INVERTEC V450-PRO) to provide an ingot in a circular shape.

The surface of the ingot is cleaned by, for example, removing the oxide layer on the surface of the ingot using a shot-blasting machine following by placing the ingot in a beaker filled with alchohol and ultrasonic-cleaning of the surface of the ingot. After that, the cleaned ingot is placed in a vacuum suction casting furnace to be vacuum-casted under an argon-atmosphere with controlled temperature (by a constant temperature control system), and followed by rapid-cooling to obtain a metallic glass alloy plate. The alloy plate is cut to have the shape of a knife, and is then polished to have a thickness of 0.38 mm followed by blade-process to sharpen the blade. After that, an aluminium oxide suspension (with diameter of 0.05 μm) solution is used to polish to obtain the zirconium-based metallic glass cutting tool (knife) of the present example.

EXAMPLE 4

Formation of Zirconium-Copper-Based Metallic Glass $((Zr_{42}Cu_{42}Al_8Ag_8)_{99.5}Si_{0.5})$ Cutting Tool Except that the composition of the raw materials is changed into $((Zr_{42}Cu_{42}Al_8Ag_8)_{99.5}Si_{0.5})$, other conditions and materials used in the present example is the same as those shown in the example 3, so as to form the zirconium-copper-based metallic glass cutting tool (knife) of the present example.

TESTING EXAMPLE 1

Energy Dispersive Spectrometry (EDS) Analysis

The cutting tools having an MGTF coated thereon and the metallic glass cutting tools according to the examples 1 to 4 are taken for component analysis by an energy dispersive spectrometry method, and the results are shown in the table 1 below.

As shown in the table 1, since the content of silicon is only 0.5 at. %, which is too rare to be detected, there is no silicon-relative peak being detected, but the detected peaks of zirconium, aluminum, copper, nickel, silver are revealed in a reasonable range.

TABLE 1

| | | Theory Atom % | Example 1 Atom % | Example 3 Atom % |
|---|---|---|---|---|
| zirconium-based metallic glass | Zr | 52.735 | 48.59 | 51.83 |
| | Cu | 29.85 | 25.63 | 29.65 |
| | Al | 8.955 | 12.62 | 11.38 |
| | Ni | 7.96 | 13.17 | 7.13 |
| | Si | 0.5 | 0 | 0 |
| zirconium-copper-based metallic | Zr | 41.79 | 42.66 | 41.02 |
| | Cu | 41.79 | 45.04 | 41.54 |
| | Al | 7.96 | 6.03 | 8.6 |
| | Ag | 7.96 | 6.27 | 8.84 |
| | Si | 0.5 | 0 | 0 |

TESTING EXAMPLE 2

X-Ray Diffraction (XRD) Analysis

X-ray scattering is performed using Shimadzu XRD-6000 to estimate the crystalline structure and properties of the metallic glass, in which the scattering angle 2θ of the X-ray diffraction ranges from 20 degrees to 80 degrees, and the scanning speed is 4°/min.

FIGS. 1 to 4 are X-ray diffraction analysis results of the zirconium-based metallic glass cutting tool, zirconium-copper-based metallic glass cutting tool, the zirconium-based metallic glass thin film cutting tool, zirconium-copper-based metallic glass thin film cutting tool of examples 3, 4, 1, 2 respectively. According to the FIGS. 1 and 2, it can be seen that only a broad peak (at 2θ=30 to 50 degrees) is shown, no sharp peak appears in the figures, which means the cutting tools provided from the examples 3 and 4 are metallic glass cutting tools.

Figure 3:
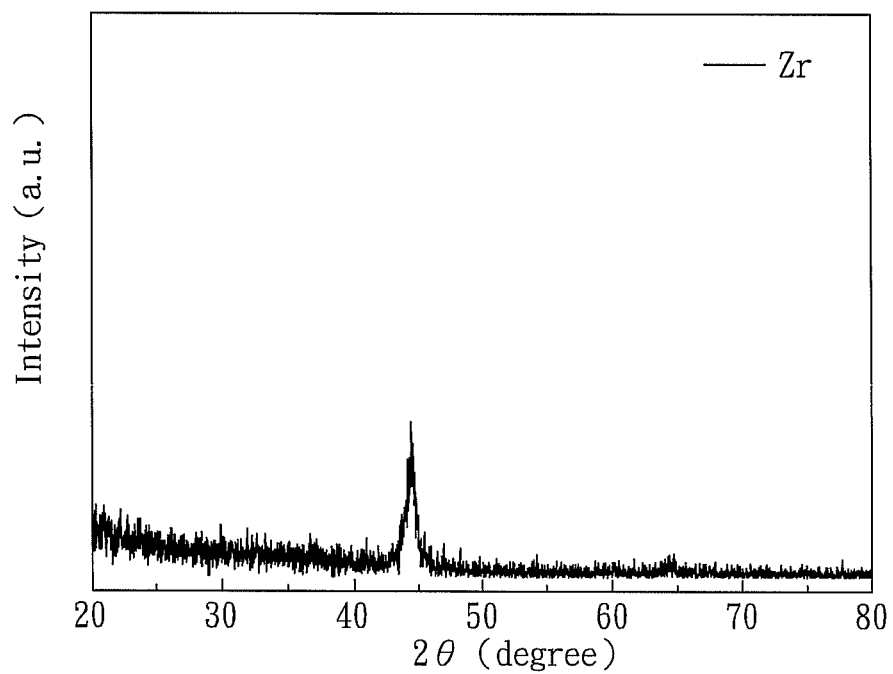
FIG. 3 is an X-ray diffraction analysis result of the metallic glass thin film-coated cutting tool in example 1 of the present invention.
Figure 4:
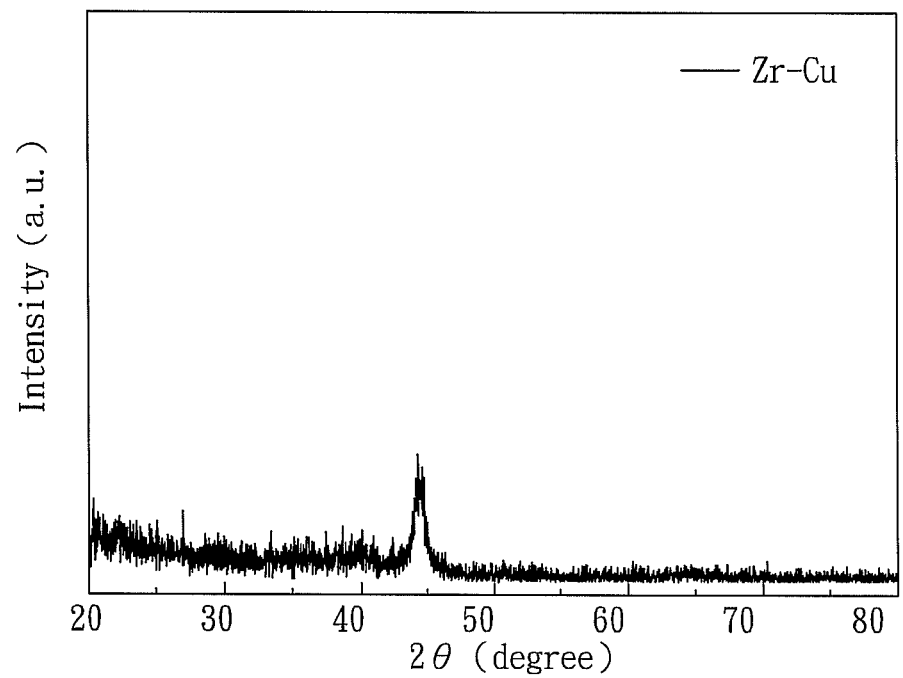
FIG. 4 is an X-ray diffraction analysis result of the metallic glass thin film-coated cutting tool in example 2 of the present invention.

FIGS. 3 and 4 are X-ray diffraction analysis results of the zirconium-based metallic glass thin film cutting tool and zirconium-copper-based metallic glass thin film cutting tool of examples 1 and 2, respectively. According to the FIGS. 3 and 4, it can be seen that crystallite peaks (2θ=44.67°, 65.02°) are shown, which belong to peaks of the cutting element itself (confirmed by JPCDS CARD), instead of the metallic glass thin film. In detail, X-ray penetrates the metallic glass thin film and reaches the cutting element, and therefore a crystallite peak diffracted from the cutting element is detected. Thus, after the elimination of those crystallite peaks, no other peaks are shown, which proves the thin films from the examples 1 and 2 are metallic glass thin films.

"An amorphous metal" means that the metal atoms in the amorphous metal have no long-term continuous regular arrangement, but only short term-regular arrangement. Amorphous metals also can be called liquid metals or non-crystalline metals, or glassy metals or metallic glass due to their similar behavior to glass of lacking long-term continuous regular arrangement. Long-term continuous regular arrangement of the metal atoms usually occurs when an alloy is cooled with a slow cooling-rate. In contrast, metallic glass alloys are formed when the alloy is cooled with a very fast cooling-rate, e.g. 106 to 1010K/sec. Under an X-ray diffraction test, a broad band can be observed with the metallic glass alloys at a low diffraction angle (i.e. 2θ=30 to 50 degree), while a sharp peak is revealed with a crystalline metal alloy.

The present testing example uses X-ray diffraction analysis to prove that the metallic glass and metallic glass thin film from the examples 1 to 4 are all in a metallic glass state.

TESTING EXAMPLE 3

Thin Film Scratching Test

The cutting tool coated with zirconium-based metallic glass thin film and the cutting tool coated with zirconium-copper-based metallic glass thin film according to the examples 1 and 2 respectively are fixed to an aluminum block and taken for their adhesive force test by using a J&L Tech Scratch Tester.

The method for obtaining the adhesive force comprises steps: smoothing the curve from the graph obtained by scratching test, and taking the first differentiation. After the differentiation, the value corresponding to the maximum is the desired minimum force that can destroy the film (i.e. the critical loading (Lc)).

According to the present testing example, the adhesive force of the zirconium-based and zirconium-copper-based metallic glass thin films to the cutting element in the examples 1 and 2 respectively are 53 N and 60 N. It can be seen that the adhesive force of the zirconium-copper-based metallic glass thin film to the cutting element is higher than that of the zirconium-based metallic glass thin film, in which a higher adhesive force means that the film is more strongly bound.

TESTING EXAMPLE 4

Hardness Test

1. Nano-Indentation Test

The cutting tool having a zirconium-based MGTF coated thereon and a cutting tool having a zirconium-copper-based MGTF coated thereon according to the examples 1 and 2, and a commercial surgical knife are taken to a nano-indentation test. A nanoindenter (TriboLab, Hysitron, USA) is used for the nano-indentation test in the present testing example. The depth (about 30 nm) of the indentation during the measurement should not be more than 1/10 of the film thickness. Five uniformly distributed press-points on the film are measured, and an average value is obtained to evaluate the hardness of the film. According to the result, the hardness of the zirconium-based and zirconium-copper-based metallic glass thin films of the examples 1 and 2 are 724±8.2 Hv and 742.3±7.6 Hv respectively, and the hardness of the commercial surgical knife is 760.7±10.9 Hv.

2. Micro-Vickers Hardness Test

The zirconium-based metallic glass cutting tool and the zirconium-copper-based metallic glass cutting tool of the examples 3 and 4, and a commercial surgical knife are taken to a Micro-Vickers Hardness test. A micro-Vickers hardness tester is used, the load weight is 500 g, and the loading time is 12 seconds. The results show that the hardness of the metallic glass cutting tools of the examples 3 and 4 are 538.9±14.5 Hv and 563.1±6.8 Hv respectively, and the hardness of the commercial surgical knife is 753.4±12.0 Hv.

TESTING EXAMPLE 5

Cutting Capacity Test

The cutting tool having a zirconium-based MGTF coated thereon, the cutting tool having an zirconium-copper-based MGTF coated thereon, the zirconium-based metallic glass cutting tool, and the zirconium-copper-based metallic glass cutting tool according to the examples 1 to 4, and a commercial surgical knife are taken to a cutting capacity test. For the test, the cutting tools are fixed by a clamp, then a rubber pad is cut by the cutting tools, and the force that is used for cutting the rubber pad is recorded, in which a cutting depth is 10 mm, a cutting speed is 9 mm/min, a thickness (t) of the rubber pad is 5 mm. The data collected after the cutting capacity test is then calculated to obtain a blade sharpness index (BSI) for the cutting tool. The information about the blade sharpness index (BSI) can reference to C. T. McCarthy, M. Hussey, M. D. Gilchrist. "On the sharpness of straight edge blades in cutting soft solids: Part I—indentation experiments", Engineering Fracture Mechanics, vol. 74, p. 2205-2224, 2007.

After calculation, the blade sharpness index (BSI) of the cutting tool having a zirconium-based MGTF coated thereon, the cutting tool having an zirconium-copper-based MGTF coated thereon, the zirconium-based metallic glass cutting tool, and the zirconium-copper-based metallic glass cutting tool according to the examples 1 to 4, and a commercial surgical knife are 0.25, 0.23, 0.26, 0.25, 0.335 respectively (as shown in table 2 below).

TABLE 2

|  | blade sharpness index (BSI) |
|---|---|
| Example 1 | 0.25 |
| Example 2 | 0.23 |
| Example 3 | 0.26 |
| Example 4 | 0.25 |
| commercial surgical knife | 0.335 |

From the above testing result, the cutting tools of the examples 1 to 4 have a better blade sharpness index than that of the commercial surgical knife, which means the edge of the cutting tools of the examples 1 to 4 of the present invention is sharper than that of the commercial surgical knife. Therefore, when the cutting tool of the present invention is used as a surgical knife, a friction force during the surgical operation can be reduced and thus is favorable for shortening the recovery time for the patient after the surgery.

As mention above, according to the present invention, a cutting element is coated with a metallic glass thin film and therefore the sharpness of the cutting element can be improved. The technique of the present invention can be applied to a wide variety of cutting tools. For example, when a surgical knife is coated with a metallic glass thin film of the present invention, surface roughness is decreased so the friction force during the surgical operation can be reduced and thus is favorable for shortening the recovery time for the patient after the surgery. Also, it is proved that the metallic glass thin film of the present invention has an excellent adhesive force so the metallic glass thin film is not easily peeled, which means the metallic glass thin film of the present invention can have a long lifespan. Furthermore, by experiment, it is proved that the metallic glass thin film of the present invention can improve the hardness of a cutting tool.

Moreover, according to the metallic glass-cutting tool of the present invention, since the whole cutting element is made from a metallic glass (either a zirconium-based metallic glass or a zirconium-copper-based metallic glass), a sharp cutting edge can be obtained after polishing (without any coated film). In detail, even though the metallic glass-cutting tool of the present invention is not coated with a metallic glass thin film, an excellent sharpness (low blade sharpness index) is realized. The metallic glass-cutting tool of the present invention can be applied to a wide variety of cutting tools. For example, when a surgical knife is made of the metallic glass according to the present invention, surface roughness is decreased so the friction force during the surgical operation can be reduced and thus is favorable for shortening the recovery time for the patient. The metallic glass-cutting tool of the present invention may also be applied to daily life-use cutting tool or military tools, such as cooking knives, surgical knives, military knives, art tooling knives, industrial knives, carpentry saws, medical saws, and metal-cutting saws, with high cutting efficiency.

Although the present invention has been explained in relation to its preferred embodiment, it is to be understood that many other possible modifications and variations can be made without departing from the spirit and scope of the invention as hereinafter claimed.

What is claimed is:

1. A cutting tool having a metallic glass (MGTF) coated thereon, which comprises:
    a cutting element having a sharpened portion, and the cutting element is made of metal;
    a metallic glass thin film which is coated on the cutting element, and a composition of the metallic glass thin film is represented by a following formula 1 or formula 2; and
    a buffering layer locating between the cutting element and the metallic glass thin film, and the thickness of the buffering layer is 10 nm to 100nm, $(Zr_aCu_bNi_cAl_d)_{100-x}Si_x$, [formula 1]

wherein $45=<a=<75$, $25=<b=<35$, $5=<c=<15$, $5=<d=<15$, $0.1=<x=<10$, $(Zr_eCu_fAg_gAl_h)_{100-y}Si_y$, [formula 2]

$35=<e=<55$, $35=<f=<55$, $5=<g=<15$, $5=<h=<15$, $0.1=<y=<10$.

2. The cutting tool having an MGTF coated thereon as claimed in claim 1, wherein a blade sharpness index (BSI) of the cutting tool is 0.2 to 0.28.

3. The cutting tool having an MGTF coated thereon as claimed in claim 2, wherein when the composition of the metallic glass thin film is represented by the formula 1, the blade sharpness index of the cutting tool is 0.23 to 0.28.

4. The cutting tool having an MGTF coated thereon as claimed in claim 2, wherein when the composition of the metallic glass thin film is represented by the formula 2, the blade sharpness index of the cutting tool is 0.2-0.25.

5. The cutting tool having an MGTF coated thereon as claimed in claim 1, wherein the thickness of the metallic glass thin film is 100 nm to 500 nm.

6. The cutting tool having an MGTF coated thereon as claimed in claim 1, wherein the cutting tool is a knife, a. saw, a blade, or a. cutter wheel.

7. The cutting tool having an MGTF coated thereon as claimed in claim 1, wherein the cutting tool has a hardness of 700 Hv to 800 Hv.

8. The cutting tool having an MGTF coated thereon as claimed in claim 7, wherein the cutting tool has a hardness of 700 Hv to 750 Hv.

9. A method of forming a metallic glass thin film (MGTF) on a cutting element, which comprises steps:
    (A) providing a metallic glass target, and a composition of the metallic glass target is represented by a following formula 1 or formula 2; and
    (B) sputtering to form the metallic glass thin film on a surface of the cutting ent by using the metallic glass target as a cathode;

$(Zr_aCu_bNi_cAl_d)_{100-x}Si_x$, [formula 1]

wherein $45=<a=<75$, $25=<b=<35$, $5=<c=<15$, $5=<d=<15$, $0.1=<x=<10$, $(Zr_eCu_fAg_gAl_h)_{100-y}Si_y$, [formula 2]

$35=<e=<55$, $35=<f=<55$, $5=<g=<15$, $5=<h=<15$, $0.1=<y=<10$.

10. The method of forming an MGTF on a cutting element as claimed in claim 9, wherein the metallic glass target is provided by the following steps:
    (A1) melting and mixing raw materials in a composition according to the formula 1 or the formula 2 and forming an ingot from the mixture;
    (A2) vacuum suction casting the ingot and cooling to form a sheet; and
    (A3) reprocessing the sheet to form the metallic glass target.

11. The method of forming an MGTF on a cutting element as claimed in claim 10, wherein the cooling in the step (A2) is rapid cooling.

12. The method of forming an MGTF on a cutting element as claimed in claim 9, wherein in the step (B), the thickness of the metallic glass thin film is 100 nm to 500 nm.

13. The method of forming an MGTF on a cutting element as claimed in claim 9, wherein in the step (B), the sputtering is performed with a gas pressure of $1\times10^{-4}$ Pa to $1\times10^{-2}$ Pa.

14. The method of forming an MGTF on a cutting element as claimed in claim 9, wherein in the step (B), the sputtering is performed in an inert gas or nitrogen gas atmosphere.

15. A metallic glass cutting tool, which comprises:
    a cutting element having a sharpened portion, the cutting element is made of a metallic glass, and a composition of the metallic glass is represented by a following formula 2;

$(Zr_eCu_fAg_gAl_h)_{100-y}Si_y$, [formula 2]

$35=<e=<55$, $35=<f=<55$, $5=<g=<15$, $5=<h=<15$, $0.1=<y=<10$.

16. The metallic glass cutting tool as claimed in claim 15, wherein the hardness of the cutting element is 500 Hv to 600 Hv.

17. The metallic glass cutting tool as claimed in claim 16, wherein the hardness of the cutting element is 500 Hv to 550 Hv.

18. The metallic glass cutting tool as claim in claim 15, wherein the blade sharpness index (BSI) of the cutting tool is 0.25 to 0.30.

19. The metallic glass cutting tool as claimed in claim 15, wherein the cutting tool is a knife, a saw, a blade, or a cutter wheel.

20. A method of providing the metallic glass cutting tool of claim 15, which comprises:
- (A) melting and mixing raw materials in a composition according to the formula 2 and forming an ingot from the mixture;
- (B) vacuum suction casting the ingot and rapid cooling to form a metallic glass sheet; and
- (C) reprocessing the metallic glass sheet to provide a cutting element having a sharpened portion, $$(Zr_e Cu_f Ag_g Al_h)_{100-y} Si_y, \quad \text{[formula 2]}$$

$35 =<e=<55, \quad 35=<f=<55, \quad 5=<g=<15, \quad 5=<h=<15, \quad 0.1=<y=<10.$

21. The method of providing a metallic glass cutting tool as claimed, in claim 20, wherein in the step (C), the metallic glass sheet is reprocessed by cutting to provide the cutting element.

\* \* \* \* \*